(12) United States Patent
Lee et al.

(10) Patent No.: US 9,732,424 B2
(45) Date of Patent: Aug. 15, 2017

(54) GAS INJECTION APPARATUS AND SUBSTRATE PROCESSING APPARATUS USING SAME

(75) Inventors: Jung-Hwan Lee, Pyungtaek-Si (KR);
Woo-Young Park, Pyungtaek-Si (KR);
Tae-Ho Hahm, Pyungtaek-Si (KR)

(73) Assignee: WONIK IPS CO., LTD. (KR)

( * ) Notice: Subject to any disclaimer, the term of this patent is extended or adjusted under 35 U.S.C. 154(b) by 975 days.

(21) Appl. No.: 13/393,498

(22) PCT Filed: Aug. 24, 2010

(86) PCT No.: PCT/KR2010/005628
§ 371 (c)(1),
(2), (4) Date: Feb. 29, 2012

(87) PCT Pub. No.: WO2011/025214
PCT Pub. Date: Mar. 3, 2011

(65) Prior Publication Data
US 2012/0152171 A1    Jun. 21, 2012

(30) Foreign Application Priority Data

Aug. 31, 2009    (KR) .......................... 10-2009-0081059

(51) Int. Cl.
*C23C 16/455* (2006.01)
*H01L 21/687* (2006.01)

(52) U.S. Cl.
CPC .. *C23C 16/45551* (2013.01); *C23C 16/45565* (2013.01); *C23C 16/45574* (2013.01); *H01L 21/68764* (2013.01); *H01L 21/68771* (2013.01)

(58) Field of Classification Search
CPC ........ C23C 16/45551; C23C 16/45574; C23C 16/45565; H01L 21/68764; H01L 21/68771

(Continued)

(56) References Cited

U.S. PATENT DOCUMENTS 6,302,964 B1   10/2001  Umotoy et al.
6,533,867 B2 *  3/2003  Doppelhammer
                                ......................... C23C 16/45574
                                                                118/715

(Continued)

FOREIGN PATENT DOCUMENTS

CN       1849410 A    10/2006
CN     101313086 A    11/2008

(Continued)

OTHER PUBLICATIONS

International Search Report dated May 18, 2011 corresponding to International Application No. PCT/KR2010/005630.

(Continued)

*Primary Examiner* — Rudy Zervigon

(57) ABSTRACT

Provided are a gas injection device and substrate processing apparatus using the same. The gas injection device includes a plurality of gas injection units disposed above a substrate support part rotatably disposed within a chamber to support a plurality of substrates, the plurality of gas injection units being disposed along a circumference direction with respect to a center point of the substrate support part to inject a process gas onto the substrates. Wherein each of the plurality of gas injection units includes a top plate in which an inlet configured to introduce the process gas is provided and an injection plate disposed under the top plate to define a gas diffusion space between the injection plate and the top plate along a radius direction of the substrate support part, the injection plate having a plurality of gas injection holes under the gas diffusion space to inject the process gas introduced through the inlet and diffused in the gas diffusion space onto the substrate. In at least one gas injection unit of the plurality of gas injection units, the process gas is introduced into the gas diffusion space at a plurality of points.

13 Claims, 4 Drawing Sheets

(58) Field of Classification Search
USPC ......... 118/715, 728, 50; 156/345.29, 345.33, 156/345.34, 345.35, 345.36, 345.26, 156/345.51
See application file for complete search history.

(56) References Cited

U.S. PATENT DOCUMENTS

| | | | |
|---|---|---|---|
| 7,572,337 B2* | 8/2009 | Rocha-Alvarez ... | C23C 16/4405 118/715 |
| 8,133,323 B2* | 3/2012 | Kakegawa ............... | C23C 16/34 118/715 |
| 8,216,419 B2* | 7/2012 | Moshtagh ......... | C23C 16/45504 118/715 |
| 8,277,888 B2* | 10/2012 | Dedontney .......... | B01J 19/0046 118/50 |
| 8,382,939 B2* | 2/2013 | Kutney ............... | H01J 37/3244 118/50 |
| 8,778,079 B2* | 7/2014 | Begarney .......... | C23C 16/45508 118/715 |
| 2001/0027026 A1 | 10/2001 | Dhindsa et al. | |
| 2004/0003777 A1* | 1/2004 | Carpenter ......... | C23C 16/45565 118/715 |
| 2005/0003600 A1 | 1/2005 | Kasai et al. | |
| 2005/0183826 A1 | 8/2005 | Choi et al. | |
| 2005/0251990 A1* | 11/2005 | Choi ..................... | C23C 16/345 29/558 |
| 2005/0255257 A1* | 11/2005 | Choi ..................... | C23C 16/345 427/585 |
| 2006/0228496 A1* | 10/2006 | Choi ................. | H01J 37/32449 427/569 |
| 2007/0071896 A1 | 3/2007 | Murphy et al. | |
| 2009/0061083 A1 | 3/2009 | Chiang et al. | |
| 2009/0151639 A1 | 6/2009 | Kasai et al. | |
| 2009/0241833 A1* | 10/2009 | Moshtagh ......... | C23C 16/45504 118/715 |
| 2010/0006031 A1* | 1/2010 | Choi ................. | C23C 16/45565 118/723 R |
| 2010/0055351 A1 | 3/2010 | Kato et al. | |
| 2010/0167551 A1* | 7/2010 | DeDontney .......... | B01J 19/0046 438/758 |
| 2010/0190341 A1 | 7/2010 | Park et al. | |
| 2012/0111271 A1* | 5/2012 | Begarney .......... | C23C 16/45508 118/724 |

FOREIGN PATENT DOCUMENTS

| | | |
|---|---|---|
| JP | 2001244256 A | 9/2001 |
| JP | 2001254181 A | 9/2001 |
| JP | 2004214669 A | 7/2004 |
| JP | 2007521633 A | 8/2007 |
| JP | 2007247066 A | 9/2007 |
| JP | 200838200 | 2/2008 |
| JP | 2008524842 A | 7/2008 |
| JP | 2009516777 A | 4/2009 |
| KR | 1020050084704 A | 8/2005 |
| KR | 1020060032668 A | 4/2006 |
| KR | 20060079198 | 7/2006 |
| KR | 1020070000067 A | 1/2007 |
| KR | 20090008799 | 1/2009 |
| KR | 1020090038444 A | 4/2009 |
| TW | 200837813 | 9/2008 |
| WO | 2009011532 A2 | 1/2009 |
| WO | WO 2009049020 A2 * | 4/2009 |
| WO | 2010067974 A2 | 6/2010 |

OTHER PUBLICATIONS

Written Opinion dated May 18, 2011 corresponding to International Application No. PCT/KR2010/005630.

* cited by examiner

[Fig. 1]
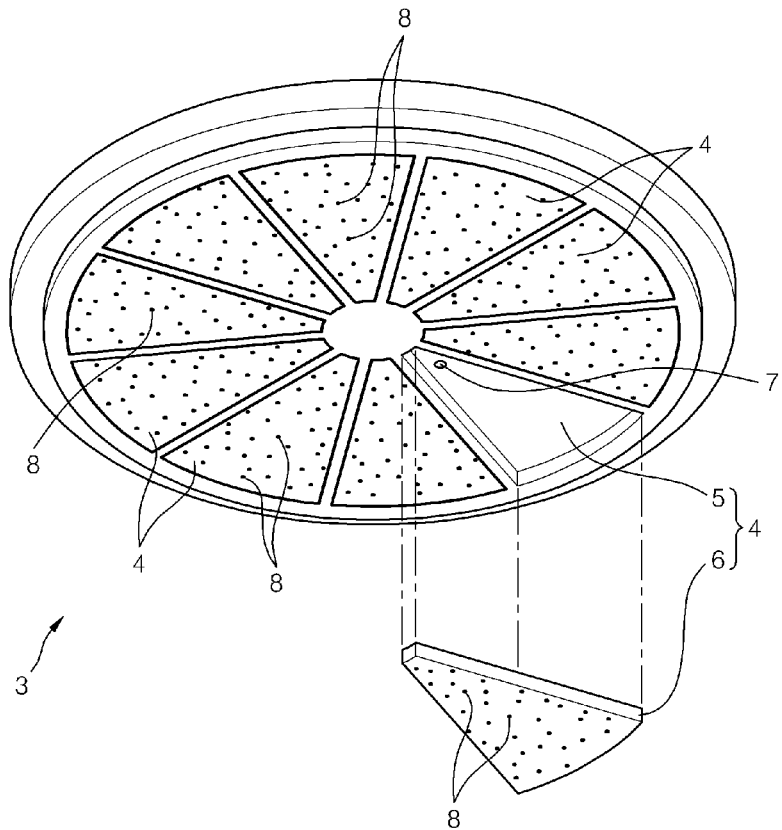
[Fig. 2]
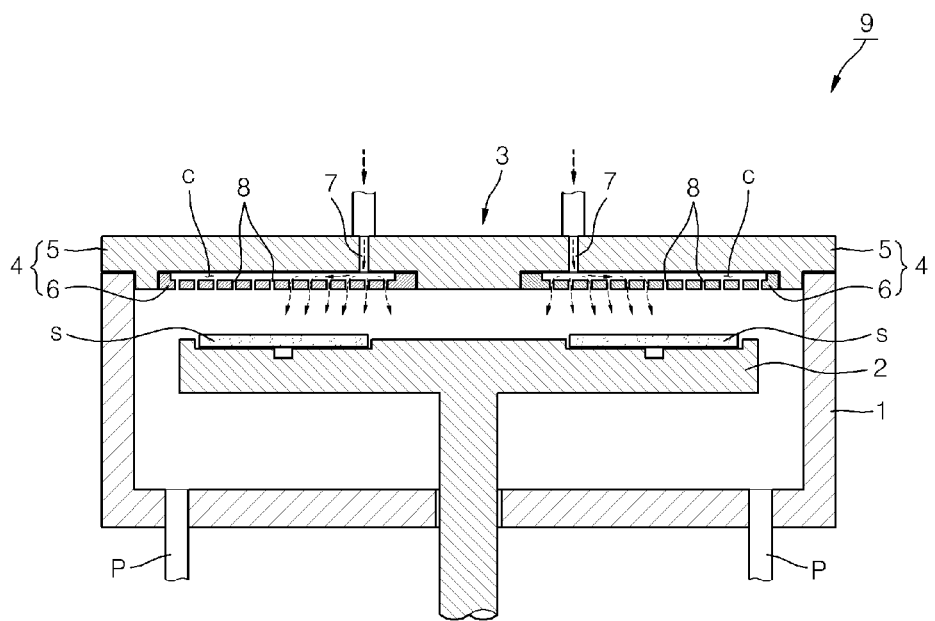

[Fig. 3]
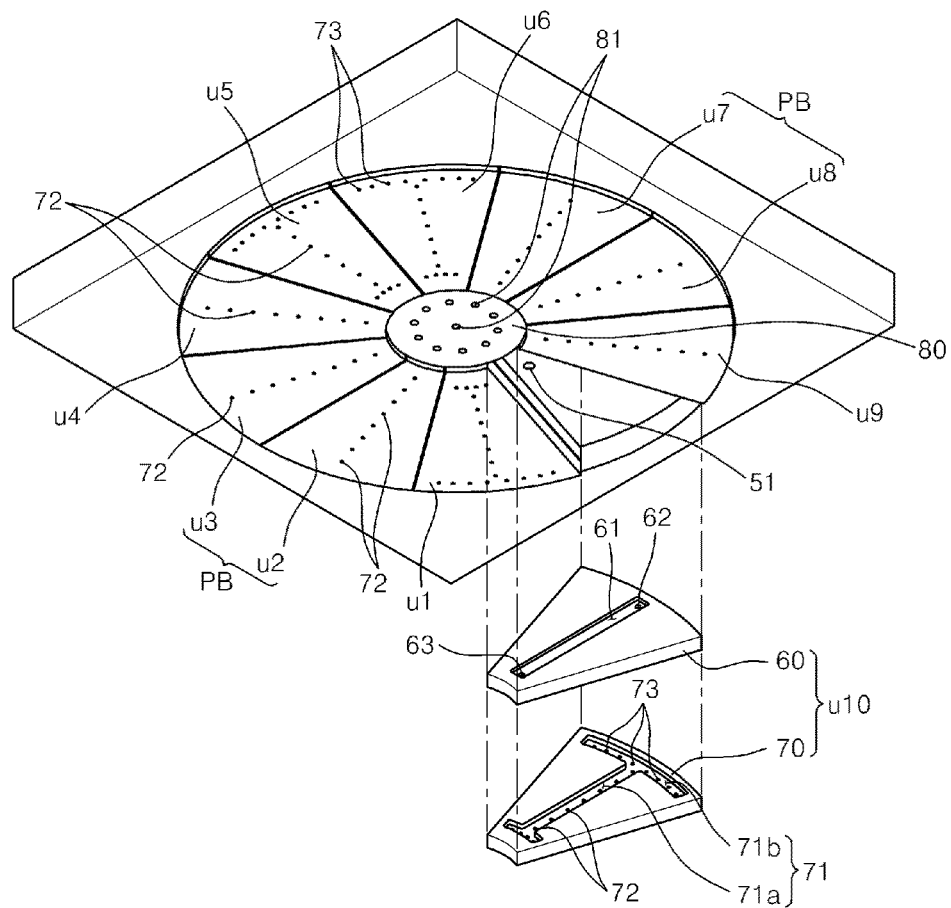
[Fig. 4]
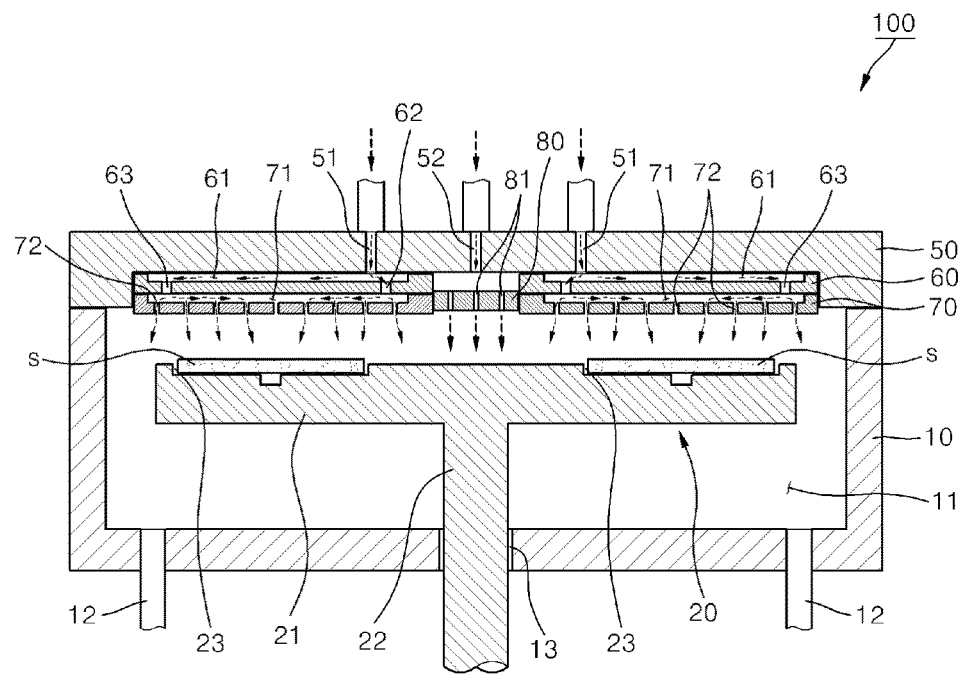

[Fig. 5]
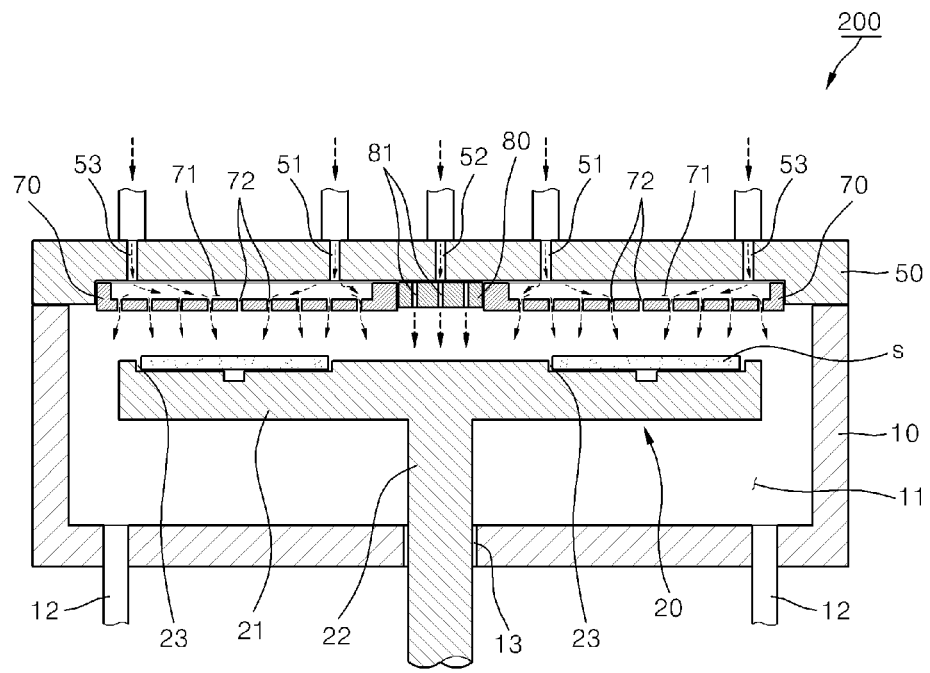
[Fig. 6]
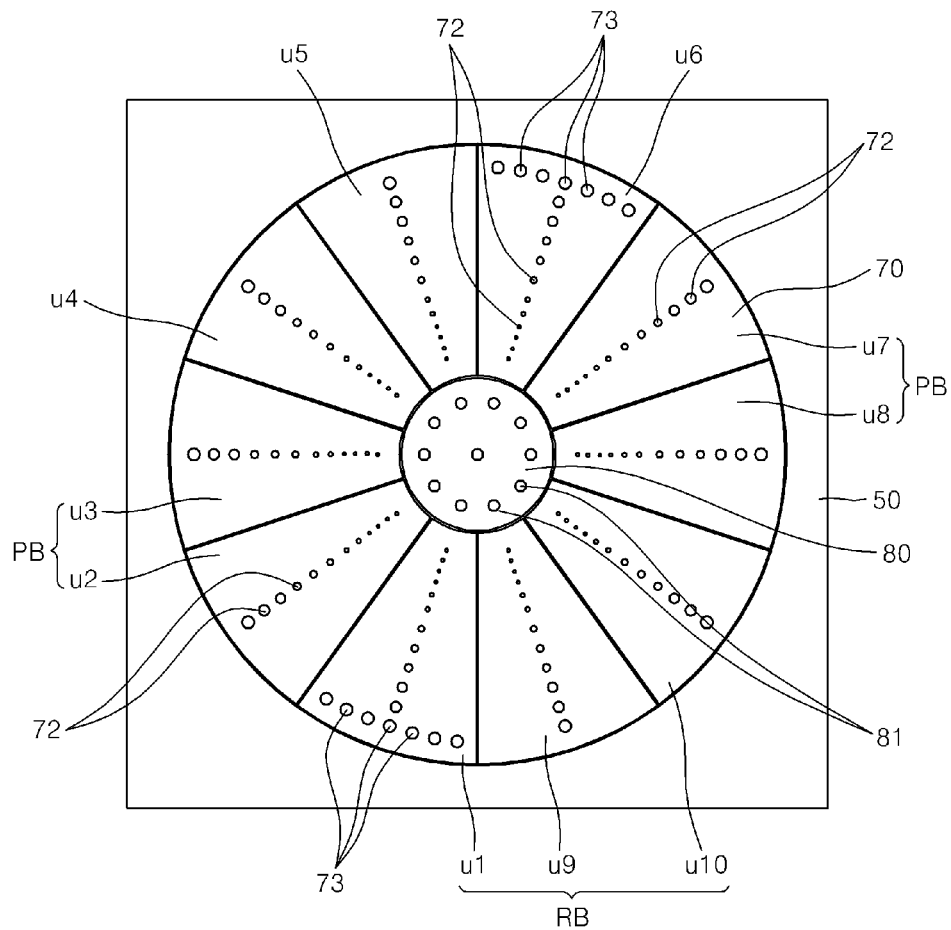

[Fig. 7]
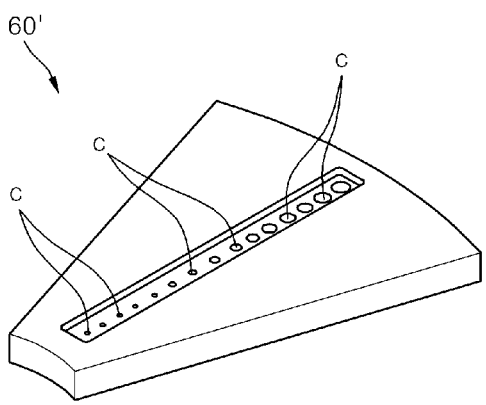

GAS INJECTION APPARATUS AND SUBSTRATE PROCESSING APPARATUS USING SAME

TECHNICAL FIELD

The present disclosure relates to a gas injection device and a substrate processing apparatus using the same, and more particularly, to a substrate processing apparatus in which a plurality of substrates are seated on a substrate support part to perform processes such as thin film deposition and a gas injection device used for the substrate processing apparatus.

BACKGROUND ART

As the scales of semiconductor devices gradually decrease, extreme thin films are increasingly required. In addition, as the sizes of contact holes are reduced, limitations in step coverage are increased more and more. Thus, an atomic layer deposition (ALD) method is being used as deposition methods for addressing these limitations. In general, the ALD method is a method in which various source gases are separately supplied to a substrate to form a thin film through surface saturations of the source gases.

The principle of the ALD method will be simply described below. When a first source gas is supplied into a chamber, the first source gas reacts with a substrate surface. As a result, a monoatomic layer is chemically adsorbed onto the substrate surface. However, when the substrate surface is saturated with the first source gas, the first source gases over the monoatomic layer are physically adsorbed, but chemically adsorbed, due to non-reactivity between the same ligands. When a purge gas is supplied, the first source gases, which are physically adsorbed, are removed by the purge gas. When a second source gas is supplied on the first monoatomic layer, a second layer is grown through substitution reaction between ligands of the first and second source gases. Since the second source gases which do not react with the first layer are physically adsorbed, the second source gases are moved by the purge gas. A surface of the second layer may react with the first source gas. The above-described processes form one cycle, and then the cycle is repeated several times to form a thin film.

A related art substrate processing apparatus for performing the above-described ALD method is illustrated in FIGS. 1 and 2.

FIG. 1 is a schematic perspective view of a gas injection device in accordance with a related art. FIG. 2 is a schematic sectional view of a substrate processing apparatus, to which the gas injection device of FIG. 1 is adopted, in accordance with the related art.

Referring to FIGS. 1 and 2, a substrate processing apparatus 9 in accordance with the related art includes a chamber 1 having an inner space and a substrate support part 2, on which a plurality of substrate s are seated, rotatably installed within the chamber 1. A gas injection device 3 for supplying a gas onto the substrates s is installed at the upper portion of the chamber 1.

The gas injection device 3 is constituted by a plurality of gas injection units 4. The gas injection units 4 are spaced apart from each other by a certain angle and distance along a circumference direction. Particularly, in the constitution of the gas injection device 3, a lead plate 5 having a circular plate shape is disposed on an upper portion of the gas injection device 3, and a plurality of injection plates 6 are coupled to a lower portion of the lead plate 5. The lead plate 5 has a plurality of gas injection holes 7 arrayed about a center point thereof to inject a gas to each of the gas injection units 4 through the gas injection holes 7. A gas injected through the gas injection holes 7 is diffused between the injection plates and the lead plate and is supplied to the substrates s through gas spray holes 8 arrayed in a row in the injection plates 6.

The substrate support part 2 successively receives gases from each of the gas injection units 4 while the substrate support part 2 is rotated within the chamber 1 to perform a thin film deposition process. For example, the substrate support part 2 receives a first source gas at a time point at which the thin film deposition process starts. Then, the substrate support part 2 successively receives a purge gas, a second source gas, and a purge gas to perform the thin film deposition process.

However, there is a limitation that the substrate process apparatus 9 to which the gas injection device 3 is adopted has inconstant deposition uniformity of the thin film. That is, to uniformly deposit the thin film on the entire area of a substrate s, it may be necessary to uniformly supply a gas on the entire area of the substrate s. However, when the gas injection device 3 configured as described above is used, a large amount of gas may be supplied onto a portion of the substrate s adjacent to a central side of the substrate support part 2, and also, a small amount of gas may be supplied onto a portion of the substrate s disposed at peripheral side of the substrate support part 2, with respect to the entire area of the substrate s.

To uniformly supply a gas onto the entire area of the substrate s, it is necessary to uniformly diffuse a gas introduced through the gas injection holes 7 into a space c between the gas injection plate 6 and the lead plate 5 and discharge the gas through the gas spray holes 8. However, as depicted with arrows in FIG. 2, the gas injected through the gas injection holes 7 is not uniformly diffused into the entire region of the space c and concentrately discharged through the gas spray holes 8 disposed at the central side of the substrate support part 2.

The substrate processing apparatus 9 illustrated in FIG. 2 adopts a so-called side pumping type in which a pumping passage P is disposed the outside thereof. Thus, since the gas injection holes 7 are forced to be defined in the central side of the gas injection device 3, the gas is not sufficiently diffused into the inside of the gas injection device 3 due to a pressure difference between the inside of the chamber 1 and the inside of the gas injection device 3.

Furthermore, since the substrate support part 2 performs the thin film deposition process while being rotated, the peripheral side of the substrate support part 2 is rotated by a distance greater than that by which the central side of the substrate support 2 is rotated, for the same time. Thus, even though the gas is uniformly supplied into the entire area, the amount of gas supplied to the peripheral side of the substrate support part 2 for the same time may be decreased.

Thus, the portion of the substrate s disposed at the peripheral side of the substrate support part 2 and the portion of the substrate s disposed at the central side of the substrate support part 2 within the one substrate s may be deposited at thicknesses different from each other.

DISCLOSURE OF THE INVENTION

Technical Problem

The present disclosure provides a gas injection device having an improved structure to uniformly supply a gas onto the entire area of a substrate and a substrate processing apparatus using the same.

Technical Solution

In accordance with an exemplary embodiment, a gas injection device includes: a plurality of gas injection units disposed above a substrate support part rotatably disposed within a chamber to support a plurality of substrates, the plurality of gas injection units being disposed along a circumference direction with respect to a center point of the substrate support part to inject a process gas onto the substrates, wherein each of the plurality of gas injection units includes: a top plate in which an inlet configured to introduce the process gas is provided; and an injection plate disposed under the top plate to define a gas diffusion space between the injection plate and the top plate along a radius direction of the substrate support part, the injection plate having a plurality of gas injection holes under the gas diffusion space to inject the process gas introduced through the inlet and diffused in the gas diffusion space onto the substrate, wherein, in at least one gas injection unit of the plurality of gas injection units, the process gas is introduced into the gas diffusion space at a plurality of points.

In accordance with another exemplary embodiment, a substrate processing apparatus includes: a chamber having an inner space in which predetermined processes with respect to substrates are performed; a substrate support part on which the plurality of substrates are seated, the substrate support part being rotatably disposed within the chamber; and a gas injection device disposed above the substrate support part to inject a gas onto the substrates, the gas injection device including the above-described constitutions.

Advantageous Effects

In the gas injection device and the substrate processing apparatus including the gas injection device according to the above-described embodiments, since the process gas is uniformly diffused over the entire area of the substrate in the gas injection units, the process gas may be uniformly injected over the entire area of the substrate.

In addition, according to the embodiments, the sizes and the arrangement density of the gas injection holes may be gradually increased toward the peripheral side of the substrate support part when considering the rotation of the substrate support part, and thus, a gas may be uniformly supplied over the entire area of a substrate in an actual process.

BRIEF DESCRIPTION OF THE DRAWINGS

FIG. 1 is an exploded perspective view of a gas injection device in accordance with a related art.

FIG. 2 is a schematic sectional view of a substrate processing apparatus to which the gas injection device of FIG. 1 is adopted.

FIG. 3 is a schematic exploded perspective view of a gas injection device in accordance with an exemplary embodiment.

FIG. 4 is a schematic sectional view of a substrate processing apparatus, to which the gas injection device is adopted, in accordance with the exemplary embodiment.

FIG. 5 is a schematic sectional view of a substrate processing apparatus, to which a gas injection device is adopted, in accordance with another exemplary embodiment.

FIG. 6 is a plan view of the gas injection device when viewed from a lower side so that a configuration of a gas injection hole is shown.

FIG. 7 is schematic perspective view for explaining a configuration of connection holes of an intermediate plate.

BEST MODE CARRYING OUT THE INVENTION

According to exemplary embodiments, an intermediate plate may be disposed between a top plate and an injection plate. A gas diffusion space may have a first gas diffusion space defined between the top plate and the intermediate plate to communicate with an inlet and a second gas diffusion space defined between the intermediate plate and the injection plate to communicate with a gas injection hole. A plurality of connection holes communicating with the second gas diffusion space may be defined at a lower side of the first gas diffusion space in the intermediate plate.

Also, according to the exemplary embodiments, the inlet may be provided in plurality along a radius direction of the substrate support part.

Also, according to the exemplary embodiments, the gas injection holes may have a plurality of first injection holes defined along the radius direction of the substrate support part and a plurality of second injection holes defined along a circumference direction of the substrate support part. The gas diffusion space may be defined along the defined directions of the first and second injection holes.

MODE FOR CARRYING OUT THE INVENTION

Hereinafter, a gas injection device and a substrate processing apparatus in accordance with exemplary embodiments will be described in detail with reference to the accompanying drawings.

FIG. 3 is a schematic exploded perspective view of a gas injection device in accordance with an exemplary embodiment. FIG. 4 is a schematic sectional view of a substrate processing apparatus, to which the gas injection device is adopted, in accordance with the exemplary embodiment.

Referring to FIGS. 3 and 4, a substrate processing apparatus 100 to which a gas injection device in accordance with an exemplary embodiment is adopted includes a chamber 10, a substrate support part 20, and a gas injection device 90.

The chamber 10 may provide a space in which predetermined processes with respect to a substrate, e.g., a deposition process is performed. When the gas injection device 90 that will be described below is coupled to an upper portion of the chamber 10, a predetermined space part 11 is defined inside the chamber 10. Since the inner space part 11 of the chamber 10 should be generally maintained at a vacuum atmosphere, a pump (not shown) is disposed outside the chamber 10. The pump (not shown) is connected to an exhaust hole 12 defined in the outside of a bottom of the chamber 10.

Also, a through hole 13 in which a rotation shaft 22 of the substrate support part 20 is inserted is defined in the bottom of the chamber 10. A substrate s is loaded and unloaded into/from the chamber 10 through a gate valve (not shown) disposed on a sidewall of the chamber 10.

The substrate support part 20 supports the substrate s and includes a support plate 21 and the rotation shaft 22. The support plate 21 has a flat circular plate shape. The support plate 21 is horizontally disposed within the chamber 10, and the rotation shaft 22 is vertically disposed on a lower portion of the support plate 21 within the chamber 10. The rotation shaft 22 extends to the outside through the through hole 13 of the chamber 10. Then, the rotation shaft 22 is connected to a driving unit to rotate and elevate the support plate 21. The rotation shaft 22 is surrounded by a bellows (now shown) to prevent the vacuum atmosphere within the chamber 10 from being released by a space between the rotation shaft 22 and the through hole 13.

A plurality of substrate seat part 23 are disposed along a circumference direction on an upper portion of the support plate 21. The substrate seat part 23 is recessed to prevent the substrate s from being separated to support the substrate s on the upper portion of the support plate 21 even though the support plate 21 is rotated. Also, a heater (not shown) is installed in a lower portion of the support plate 21 to heat the substrate s at a predetermined process temperature.

The gas injection device 90 injects process gases such as a source gas, a reaction gas, and a purge gas onto the plurality of substrates s seated on the substrate support part 20 and is coupled to an upper portion of the chamber 10.

In the current embodiment, the gas injection device 90 includes a plurality of gas injection units u1 to u10. The gas injection units u1 to u10 are disposed along a circumference direction with respect to a center point of the substrate support part 20. Each of the gas injection units u1 to u10 includes a top plate 50, an intermediate plate 60, and an injection plate 70. The top plate 50 has a square plate shape with a predetermined thickness. The intermediate plate 60 and the injection plate 70 of each of the gas injection units u1 to u10 are successively coupled to a lower portion of the top plate 50.

That is, the gas injection units u1 to u10 may respectively occupy portions of the top plate 50 along a circumference direction of the top plate 50 to share the top plate 50. Inlets 51 having a number corresponding to the number of gas injection units u1 to u10 are disposed in a central portion of the top plate 50. The inlets 51 are disposed along a circumference direction with respect to a center point of the top plate 50. Each of the inlets 51 is selectively connected to an external gas supply source (not shown).

Although the top plate may be integrally provided as described above, i.e., the injection plate of each of the gas injection units is coupled to the top plate so that the injection plates occupy portions of the top plate, the present disclosure is not limited thereto. For example, the top plate may be separately provided for each gas injection unit. That is, although not shown, in another exemplary embodiment, a frame may be coupled to an upper portion of a chamber. Then, a plurality of top plates may be coupled to the frame along a circumference direction, and an injection plate may be coupled to a lower portion of each of the top plates. The top plate as set forth in claims may be integrated with respect to all of the gas injection units or provided in plurality. In the current embodiment, the integrated top plate 50 may be described as an example.

The intermediate plate 60 and the injection plate 70 may allow a gas introduced into the inlets 51 of the top plate 50 to be uniformly sprayed onto the entire area of the substrate s. Each of the intermediate plate 60 and the injection plate 70 has an approximately fan shape. The intermediate plate 60 is coupled to a lower portion of the top plate 50, and the injection plate 70 is coupled to a lower portion of the intermediate plate 60.

A first groove 61 is lengthily defined in an upper portion of the intermediate plate 60 along a radius direction of the substrate support part 20. When the intermediate plate 60 is closely attached to the top plate 50, a first gas diffusion space is defined between a recessed surface in the first groove 61 and a bottom surface of the top plate 50. The first gas diffusion space communicates with the inlets 51 defined in the top plate 50. Also, a plurality of connection holes 52 and 53 pass through lower portions of both sides of the first groove 61.

A second groove 71 is recessed in an upper portion of the injection plate 70. The second groove 71 is constituted by a linear part 71a lengthily disposed along the radius direction of the substrate support part 20 and a circumference part 71b extending from an end of the linear part 71a along the circumference direction of the substrate support part 20. When the injection plate 70 is closely attached to the intermediate plate 60, a second gas diffusion space is defined between a bottom surface of the intermediate plate 70 and the second groove 71.

The second gas diffusion space is connected to the two connection holes 62 and 63 defined in the intermediate plate 60 to communicate with the first gas diffusion space. Also, a plurality of first injection holes 72 pass through a lower portion of the linear part 71a of the second groove 71 and are disposed in a row along the linear part 71a. Also, a plurality of second injection holes 73 pass through a lower portion of the circumference part 71b. The first injection holes 72 and the second injection holes 73 communicate with the space part 11 of the chamber 10 in which the substrate s is disposed.

In the gas injection units u1 to u10 including the above-described constitutions, the inlets 51 of the top plate 50 may be biasedly disposed toward a center of the substrate support part 20. A so-called side pumping structure such as the substrate processing apparatus 100 in which the exhaust hole 12 connected to the pump (not shown) is disposed outside the substrate support part 20, the inlets 51 should be biasedly disposed toward a central side of the top plate 50. As a result, a large amount of gas may contact the substrate s while the supplied gas flows from the central side of the substrate support part 20 toward the outside. However, as described in the related art, in the structure in which the inlets 51 are disposed inward, and the pumping operation is performed from the outside, a gas does not uniformly flow over the entire area of the substrate s. Thus, in the current embodiment, the gas within the gas injection units u1 to u10 may be uniformly diffused over the entire area of the substrate s.

That is, in the current embodiment, as depicted with arrows in FIG. 4, a process gas introduced into the inlets 51 may be diffused into both sides along the radius direction of the substrate support part 20 and then introduced into the second gas diffusion space at the two points through the connection holes 62 and 63 defined in both sides of the first groove 61. Then, the process gas may be discharged into the first and second injection holes 72 and 73 while flowing toward the central side.

In the related art, a gas introduced into a single inlet is injected onto a substrate through a gas injection hole in a state where the gas is not sufficiently diffused. However, in the current embodiment, a gas may be firstly diffused into both sides of the radius direction of the substrate support part 20 through the first gas diffusion space defined by the intermediate plate 60 to allow the gas to be introduced into the second gas diffusion space at a plurality of points (both ends of the first gas diffusion space). Thus, the gas introduced from the both sides may be diffused over the first gas diffusion space and uniformly supplied over the entire area of the substrate s.

Referring to FIGS. 3 and 4, the gas injection units are classified into a source gas injection unit u5 for injecting a source gas, reaction gas injection units u1, u9, and u10 for injecting a reaction gas, and purge gas injection unit u2, u3, u7, and u8 for injecting a purge gas. However, since the gas injection units have the substantially same configuration, the classification is based just on the types of gas introduced to each of the gas injection units. That is, a gas introduced to each gas injection unit is changed according to a process to be performed, and thus the gas injection units may be variously combined and varied.

For example, in the current embodiment, the source gas injection unit expressed as a reference numeral u5 supplies the source gas containing a metal such as zirconium (Zr) onto the substrate support part 20, and the reaction gas injection units expressed as reference numerals u1, u9, and u10 supply the reaction gas, such as ozone ($O_3$) reacting with source gas, onto the substrate support part 20. Although the source gas and the reaction gas are described separately for convenience, feed gases as set forth in the claims of the present disclosure may include the source gas and the reaction gas.

The purge gas injection units u2, u3, u7, and u8 are disposed between the source gas injection unit u5 and the reaction gas injection units u1, u9, and u10. The purge gas injection units u2, u3, u7, and u8 inject a non-reactive gas such as nitrogen or argon to physically remove the source gas and the reaction gas which are not chemically adsorbed to a substrate.

Also, in the current embodiment, a central purge gas injection unit 80 may be further provided in the central portion of the gas injection units to prevent the gases from being mixed between the source gas injection unit u5 and the reaction gas injection units u1, u9, and u10. In the central purge gas injection unit 80, a gas introduction hole 52 is defined in the central portion of the top plate 50, and a plurality of injecting hole 81 are defined under the gas introduction hole 52 to inject the purge gas onto the central side of the substrate support part 20. The purge gas is injected to form an air curtain to prevent the source gas and the reaction gas from being mutually mixed at the central side of the substrate support part 20.

In the current embodiment, the gas injection units injecting the same gas may be disposed adjacent to each other to form a gas injection block as a group. Referring to FIGS. 3 and 6, the three reaction gas injection units u1, u9, and u10 are disposed adjacent to each other to form a reaction gas block RB. Also, two groups u2 and u3, and u7 and u8 of the purge gas injection units u2, u3, u7, and u8 are disposed on both sides of the reaction gas injection block RB to form purge gas injection blocks PB.

Also, although not shown, the gas injection units may have different areas according to embodiments. For example, if two purge gas injection units form a purge gas injecting block PB in the current embodiment, a purge gas injection unit in another embodiment may have the same area as that of the purge gas injecting block PB.

In an exemplary embodiment, a buffer injection unit is disposed between a source gas injection unit and a purge gas injection unit. The buffer injection unit is configured to space the source gas injection unit apart from the purge gas injection unit. Also, a separate process gas is not introduced into the buffer injection unit. However, since the buffer injection unit has the same structure as those of other gas injection units, a process gas may be selectively introduced into the buffer injection unit if necessary.

In the current embodiment, the two buffer injection units are disposed between the source gas injection unit u5 and the purge gas injection units u3 and u7 to prevent the source gas and the purge gas from being mixed with each other.

In the current embodiment configured as described above, when the substrate support part 20 is rotated while the process gas is injected from each of the gas injection units u1 to u10, a plurality of substrates s seated on the substrate support part 20 are successively exposed to the source gas, the purge gas, the reaction gas, and the purge gas to deposit a thin film while forming a layer through substitution reaction between ligands of the source gas and the reaction gas on a top surface of the substrates s. In the current embodiment, since a gas is uniformly supplied over the entire area of the substrates through the first gas diffusion space and the second gas diffusion space in each of the gas injection units, the thin film may be uniformly deposited over the entire area of the substrates s.

As described above, to uniformly diffuse a gas over the entire area of the substrates s, it may be desired to completely diffuse the gas into the gas diffusion space defined directly above the gas injection holes for injecting the gas. For this, it may be very important to introduce a gas into the gas diffusion space at the plurality of points. That is, if a gas is introduced into the gas diffusion space at a single point, the gas may be discharged into the gas injection holes in a state where the gas is not sufficiently diffused in the gas diffusion space, as described in the related art.

In the current embodiment, even though one inlet 51 is connected to each of the gas injection units 50, a gas may be divided into two passages through the intermediate plate 60 so that the gas is introduced into the second gas diffusion space defined directly above the first and second injection holes 72 and 73 at a plurality of points (two points).

However, unlike the above-described structure, a gas may be introduced into the gas diffusion space at a plurality of points. This structure will be described with reference to FIG. 5. FIG. 5 is a schematic sectional view of a substrate processing apparatus, to which a gas injection device is adopted, in accordance with another exemplary embodiment.

Referring to FIG. 5, unlike the above-described embodiment, a substrate process apparatus 200 in accordance with another exemplary embodiment includes a gas injection device 50 constituted by only a top plate 50 and an injection plate 70. The intermediate plate 60 in accordance with the above-described embodiment is omitted. However, a gas is introduced into a gas diffusion space defined between the top plate 50 and the injection plate 70 at two points. That is, a plurality of inlets 51 and 53 are disposed in the top plate 50 of each of gas injection units. Thus, a gas may be introduced into the gas diffusion space at the plurality of points. Particularly, in another exemplary embodiment, since the inlets 51 and 53 are respectively disposed on both ends along a radius direction of a substrate support part 20, a gas introduced through the inlets 51 and 53 may flow in directions approaching each other as depicted with arrows in FIG. 5. As a result, the gas introduced through the two inlets 51 and 53 may be completely diffused in the gas diffusion space and then uniformly injected over the entire area of a substrate s through an injection hole 72.

Also, in case where the plurality of inlets are provided, an amount of process gas introduced through the inlet 53 disposed outwardly may be greater than that introduced through the inlet 51 disposed adjacent to a central side of the substrate support part 20. That is, since the process is performed while the substrate support part 20 is rotated, even though the same amount of gas is supplied over the entire area of the substrate s along a diameter direction of the substrate s, a portion of the substrate s disposed at the peripheral side of the substrate support part 20 may have a rotation movement amount greater than that of a portion of the substrate s at the central side of the substrate support part 20, for the same time. Thus, the portion at the peripheral side of the substrate support part 20 may have a contact amount less than that of the portion at the central side of the substrate support part 20. Thus, to uniformly supply a process gas over the entire area of the substrate s, an amount of process gas injected through the inlet disposed adjacent to the central side of the substrate support part 20 should be less than that of process gas injected through the inlet disposed outwardly.

In components which do not described in another exemplary embodiment, components having the same reference numerals as those of the foregoing embodiment have the same constitution and operation as those of the foregoing embodiment. Thus, descriptions with respect to the same components as those of the foregoing embodiment will be omitted.

So far, to uniformly inject a gas over the entire area of the substrate s, the structure in which the gas is wholly diffused in the gas injection units u1 to u10 was described. However, to uniformly inject a gas over the entire area of the substrate s, it is necessary to adjust the arrangement of the gas injection holes. That is, as described in the related art, since the process is performed while the substrate support part 20 is rotated, even though the same amount of gas is supplied over the entire area of the substrate s along a diameter direction of the substrate s, a portion of the substrate s disposed at the peripheral side of the substrate support part 20 may have a rotation movement amount greater than that of a portion of the substrate s at the central side of the substrate support part 20, for the same time. Thus, the portion at the peripheral side of the substrate support part 20 may have a gas contact amount less than that of the portion at the central side of the substrate support part 20.

Thus, in the current embodiment, as shown in FIG. 6, the gas injection holes may be adjusted in arrangement and size to inject a more amount of gas onto the portion of the substrate s disposed at the peripheral side of the substrate support part 20. Referring to FIG. 6, each of first injection holes 72 has a diameter gradually increasing outward from a central side of the substrate support part 20, and also the first injection holes 72 have an arrangement density gradually increasing outward from the central side of the substrate support part 20. Thus, a more amount of gas may be injected toward the outside. Also, second injection holes 73 may be defined along a circumference direction of the substrate support part 20 to supply a more amount of gas onto the outer potion of the substrate support part 20.

However, it may be necessary to adjust the arrangement of the gas injection holes and connection holes defined in an intermediate plate 60. That is, as shown in FIG. 7, the larger number of connection holes may be defined in an intermediate plate 60' when compared to the intermediate plate of FIG. 3. Referring to FIG. 7, a plurality of connection holes c are defined in the intermediate plate 60' in a row along a radius direction of the substrate support part 20. The number of connection holes c is gradually increased from the central side of the substrate support part 20 toward the outside, as well as, each of the connection holes c has a size gradually increasing outward from the central side of the substrate support part 20. Thus, a process gas introduced through the inlets may be further discharged through the connection holes defined at the peripheral side of the substrate support part 20 to enhance the diffusion of the process gas into the whole gas diffusion space.

That is, as shown in FIGS. 6 and 7, in the arrangement of the connection holes c of the intermediate plate 60' and the first injection holes 72 of the injection plate, the larger number of connection holes c and first injection holes 72 may be defined in the peripheral side of the substrate support part 20 than at the central side of the substrate support part 20. Also, each of the connection holes c and the first injection holes 72 may have a size gradually increasing outward from the central side of the substrate support part 20. Considering the rotation of the substrate support part 20, the connection holes c and the first injection holes 72 may be adjusted in arrangement and size to achieve substantially uniform gas supply over the entire area of the substrates s.

In the embodiments, a gas is introduced to a gas diffusion space at a plurality of points to wholly diffuse gas in the gas injection units u1 to u10, and also the larger number of gas injection holes are defined at the peripheral side of the gas injection units u1 to u10 along the radius direction of the substrate support part 20 to uniformly supply a gas over the entire area of the substrates s. Accordingly, the uniformity of the thin film deposited on the substrates s may be secured using the gas injection device 90 and the substrate processing apparatuses 100 and 200.

Although the first gas diffusion space between the top plate 50 and the intermediate plate 60 is defined in the intermediate plate 60 by the first groove 61 and the bottom surface of the top plate 50, the present disclosure is not limited thereto. For example, a groove may be recessed in a bottom surface of the top plate 50 to define the first gas diffusion space. In the same manner, the second gas diffusion space may be defined by defining a groove in a bottom surface of the intermediate plate 60.

Although the second groove 71 defined in the injection plate 70 includes the linear part and the circumferential part, the first injection holes are defined under the linear part, and the second injection holes are defined under the circumferential part, only the linear part and the first injection holes may be provided without providing the circumferential part and the second injection holes.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A gas injection device comprising:
a plurality of gas injection units disposed above a plurality of substrate seat parts on a support plate rotatably disposed within a chamber to support a plurality of substrates, wherein the plurality of substrate seat parts are disposed on an upper portion of the support plate along a circumference direction of the support plate, wherein the plurality of gas injection units are disposed along the circumference direction with respect to a center point of the support plate to inject a process gas onto the substrates, and wherein an area covered by the plurality of gas injection units is larger than an area of the upper portion of the support plate,
wherein each of the plurality of gas injection units comprises:

a top plate having a plurality of inlets formed therein and arranged along a radial direction of the support plate, wherein the plurality of inlets are configured to introduce the process gas; and an injection plate having a linear portion of a first groove recessed within an upper portion thereof and extending linearly along a radius direction of the support plate, wherein the injection plate is disposed under the top plate and attached to the top plate to define a gas diffusion space between the linear portion of the first groove in the injection plate and a bottom surface of the top plate, wherein a plurality of first gas injection holes are disposed along the linear portion of the first groove and configured to inject the process gas introduced through the at least one of the plurality of inlets and diffused in the gas diffusion space onto the substrate, and wherein a diameter of the first gas injection holes increases linearly outward from a central side of the support plate such that the first gas injection holes have at least three different diameters, wherein, in at least one gas injection unit of the plurality of gas injection units, the process gas is introduced into the gas diffusion space at a plurality of points, wherein an amount of process gas introduced through the plurality of inlets disposed adjacent to the central side of the support plate is less than an amount of process gas introduced through the inlets disposed at a peripheral side of the support plate, wherein the central side and the peripheral side are separated from one another along the radial direction of the support plate, and wherein a circumference portion of a first groove is recessed in the upper portion of injection plate, wherein the circumference portion of the first groove extends from an end of the linear portion of the first groove along the circumference direction of the support plate to define a second gas diffusion space between the circumference portion of the first groove in the injection plate and a bottom surface of the top plate, and wherein a plurality of second gas injection holes are disposed along the circumference portion of the first groove.

2. The gas injection device of claim 1, wherein an intermediate plate is disposed between the top plate and the injection plate, the gas diffusion space comprises a first gas diffusion space defined between the top plate and the intermediate plate and connected to the inlet and a second gas diffusion space defined between the intermediate plate and the injection plate and connected to the gas injection holes, and the intermediate plate comprises a plurality of connection holes defined under the first gas diffusion space and connected to the second gas diffusion space.

3. The gas injection device of claim 1, wherein the inlet configured to introduce the process gas is biasedly disposed toward a central side of the support plate.

4. The gas injection device of claim 1, wherein the injection plate of each of the gas injection units is disposed along the circumference direction with respect to a center of the support plate to occupy a portion of the top plate, and each of the gas injection units is coupled to a lower portion of the top plate.

5. The gas injection device of claim 2, wherein the larger number of connection holes defined in the intermediate plate are defined at the peripheral side of the support plate than at the central side of the support plate along the radius direction of the support plate.

6. The gas injection device of claim 2, wherein each of the connection holes defined at the peripheral side of the support plate along the radius direction of the support plate among the plurality of connection holes defined in the intermediate plate has a diameter greater than a diameter of each of the connection holes defined at the central side of the support plate.

7. The gas injection device of claim 1, wherein the gas injection units comprise a plurality of source gas injection units configured to inject a source gas and a plurality of purge gas injection units configured to inject a purge gas.

8. The gas injection device of claim 7, further comprising a central purge gas injection unit disposed at a central portion of the plurality of gas injection units disposed along the circumference direction of the support plate so that the purge gas for purging the source gases is supplied toward the central side of the support plate.

9. The gas injection device of claim 7, wherein two or more injection units disposed adjacent to each other to inject the same gas among the source gas injection units and the purge gas injection units are grouped to form a gas injection block.

10. The gas injection device of claim 9, wherein the source gas injection units comprise injection units configured to inject the source gas and injection units configured to inject a reaction gas reacting with the source gas, and the plurality of injection units configured to inject the source gas or the plurality of injection units configured to inject the reaction gas are grouped to form a gas injection block.

11. The gas injection device of claim 7, wherein a buffer injection unit through which a gas is selectively injected or not injected is disposed between the plurality of gas injection units.

12. A substrate processing apparatus comprising: a chamber having an inner space in which predetermined processes with respect to substrates are performed; a substrate support part on which the plurality of substrates are seated, the substrate support part being rotatably disposed within the chamber; and a gas injection device disposed above the substrate support part to inject a gas onto the substrates, wherein the gas injection device is configured according to any one of claims 1, 4, and 7 to 11.

13. The gas injection device of claim 1, wherein a diameter of the second gas injection holes is greater than a diameter of the first gas injection holes.

* * * * *